(12) United States Patent
Wall et al.

(10) Patent No.: US 11,175,191 B1
(45) Date of Patent: Nov. 16, 2021

(54) MECHANICALLY ACTUATED AND SHUNTED MAGNETOSTRICTIVE DIPOLE TRANSMITTER

(71) Applicant: HRL Laboratories, LLC, Malibu, CA (US)

(72) Inventors: Walter W. Wall, Los Angeles, CA (US); Skyler Selvin, San Jose, CA (US); Geoffrey P. McKnight, Los Angeles, CA (US); Casey J. Sennott, Calabasas, CA (US); David W. Shahan, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 309 days.

(21) Appl. No.: 16/393,830

(22) Filed: Apr. 24, 2019

Related U.S. Application Data

(60) Provisional application No. 62/689,755, filed on Jun. 25, 2018.

(51) Int. Cl.
*G01R 33/09* (2006.01)
*G01L 1/12* (2006.01)
*H01L 41/12* (2006.01)

(52) U.S. Cl.
CPC .............. *G01L 1/125* (2013.01); *G01R 33/09* (2013.01); *H01L 41/12* (2013.01)

(58) Field of Classification Search
CPC .......... G01R 33/18; G01R 33/09; G01B 7/24; G01L 1/12; G01L 1/125; H01L 41/12; G01H 13/00
See application file for complete search history.

(56) References Cited

U.S. PATENT DOCUMENTS

| | | | |
|---|---|---|---|
| 4,530,489 A | 7/1985 | Hirano | |
| 5,712,566 A | 1/1998 | Taicher | |
| 6,130,612 A | 10/2000 | Castellano | |
| 6,273,965 B1 | 8/2001 | Pulvirenti | |
| 7,851,971 B2 * | 12/2010 | Chang | H04R 31/00 310/320 |
| 10,132,699 B1 | 11/2018 | Pillars | |
| 10,510,945 B1 | 12/2019 | Langlois | |
| 2007/0001883 A1 | 8/2007 | Parsche | |
| 2010/0002773 A1 | 11/2010 | Schantz | |

(Continued)

OTHER PUBLICATIONS

U.S. Appl. No. 16/393,852, filed Apr. 24, 2019, McKnight.

(Continued)

*Primary Examiner* — Brandi N Hopkins
(74) *Attorney, Agent, or Firm* — Ladas & Parry

(57) ABSTRACT

A magnetic transmitting antenna has a beam member having a first end and a second end, wherein the beam member comprising: an elastic member; at least one magnetoelastic member disposed on a first surface of the elastic member; and an actuator disposed on a second surface of the elastic member, wherein the actuator is configured to apply stress to the elastic member thereby applying a bending stress thereto for changing the magnetic permeability of the at least one magnetoelastic member, which in turn, changes an external magnetic field. At least one magnet is disposed adjacent to the magnetoelastic member such that magnetization is induced in the magnetoelastic member.

34 Claims, 10 Drawing Sheets

(56) References Cited

U.S. PATENT DOCUMENTS

| | | | |
|---|---|---|---|
| 2014/0217932 A1 | 8/2014 | Bright | |
| 2015/0318624 A1 | 11/2015 | Schantz | |
| 2016/0294056 A1 | 10/2016 | Manteghi | |
| 2017/0040674 A1 | 2/2017 | Suh | |
| 2017/0279471 A1 | 9/2017 | Manteghi | |
| 2017/0299757 A1 | 10/2017 | Bench | |
| 2018/0129338 A1* | 5/2018 | Ihalainen | F15B 15/2815 |
| 2020/0034583 A1 | 1/2020 | Nikitin | |

OTHER PUBLICATIONS

U.S. Appl. No. 16/393,816, filed Apr. 24, 2019, Selvin.

U.S. Appl. No. 16/011,964, filed Jun. 19, 2018, McKnight.

Azad, U., "Direct Antenna Modulation (DAM) for Enhanced Capacity Performance of Near-Field Communication (NFC) Link", IEEE Transactions on Circuits and Systems I: Regular Papers, vol. 61, No. 3, Mar. 2014, pp. 902-010.

Babakhani, et al., "Transmitter Architectures Based on Near-Field Direct Antenna Modulation", IEEE Journal of Solid-State Circuits, p. 2674-2692, vol. 43, No. 12, Dec. 2008.

Bickford et al., "Performance of Electrically Small Conventional and Mechanical Antennas", IEEE Transactions on Antennas and Propagation, vol. 67, No. 4, Apr. 2019, pp. 2209-2223.

Hansen, R.C., "Small Antenna Handbook", John Wiley and Sons, Inc. 2011, Chapter 3, pp. 59-133.

Keller, S.D., et al., "Direct antenna modulation: analysis, design, and experiment", 2006 IEEE Antennas and Propagation Society International Symposium, Jul. 9-14, 2006, pp. 909-912.

Manteghi, M. "An electrically small antenna concept design for transmitting a baseband signal," 2017 IEEE International Symposium on Antennas and Propagation & USNC/URSI National Radio Science Meeting, Jul. 9-14, 2017, pp. 1481-1482.

Xu, et al., "A direct antenna modulation (DAM) transmitter with a switched electrically small antenna," 2010 International Workshop on Antenna Technology (iWAT), Mar. 1-3, 2010 (4 pages).

Yao, et al. "Direct antenna modulation—a promise for ultra-wideband (UWB) transmitting", 2004 IEEE M1T-S International Microwave Symposium Digest, Jun. 6-11, 2004, pp. 1273-1276.

From U.S. Appl. No. 16/393,816 (unpublished, non-publication request filed), Office Action dated Mar. 16, 2021.

* cited by examiner

Shunts 16 (high permeability members) can be connected across each PM.

Shunts need not be utilized.

MECHANICALLY ACTUATED AND SHUNTED MAGNETOSTRICTIVE DIPOLE TRANSMITTER

CROSS REFERENCE TO RELATED APPLICATIONS

This application claims the benefit of U.S. Provisional Patent Application Ser. No. 62/689,755 filed on 25 Jun. 2018 and entitled "A Mechanically Actuated and Shunted Magnetostrictive Dipole Transmitter" this disclosure of which is hereby incorporated herein by reference.

This application is related to U.S. patent application Ser. No. 16/011,964 filed on Jun. 19, 2018 which claims the benefit of US Provisional Patent Application Ser. No. 62/522,519 filed Jun. 20, 2017 and entitled "Vibrational Magnetic Transmitter", the disclosure of which is hereby incorporated reference.

This application is also related to U.S. patent application Ser. No. 16/393,852 filed on the same day as this application and which claims the benefit of U.S. Provisional Patent Application Ser. No. 62/689,759 filed on 25 Jun. 2018 and entitled "A Mechanically Actuated Magnetostrictive Dipole Transmitter", the disclosures of which are hereby incorporated by reference.

This application is also related to U.S. patent application Ser. No. 16/393,816 filed on the same day as this application and which claims the benefit of U.S. Provisional Patent Application Ser. No. 62/689,758 filed on 25 Jun. 2018 and entitled "A Mechanically Modulated Loopstick Antenna", the disclosures of which are hereby incorporated by reference.

STATEMENT REGARDING FEDERALLY SPONSORED RESEARCH OR DEVELOPMENT

This invention was made with Government support under Contract No. HR0011-17-C-0117. The Government has certain rights in the invention.

TECHNICAL FIELD

The technology disclosed herein relates an oscillating magnetic field which is created by varying the permeability between permanent magnets or electromagnets as well as the reluctance of a shunt magnetostrictive element or member (which may also be called a magnetoelastic element or member) element.

BACKGROUND

At low electromagnetic (EM) frequencies (i.e. <100 kHz) compact and efficient antennas and transmitters are difficult to produce. Very Low Frequency (VLF) 3-30 kHz and ultra low frequency (ULF) 0.3-3 kHz electromagnetic waves are challenging to produce as frequency is decreased, because the physical size of the antenna, which is normally a fraction (for example, one-fourth to one-half) of a single wavelength in size, becomes impractically large at frequencies below 100 kHz. Conventional antennas for VLF transmitters can be as large as many acres and require wires suspended hundreds of feet off the ground for efficient operation. A portable transmitter with reasonable power consumption does not currently exist. The production of sizable magnetic fields using loop stick antennas with oscillating current requires significant power due to the resistive losses in the magnetizing coils.

In a related U.S. patent application Ser. No. 16/011,964, a concept for efficiently modulating the magnetic field of a static permanent magnet or electromagnet was introduced. This concept used a variable reluctance path created by a mechanically actuated magnetostrictive element. In a related U.S. patent application Ser. No. 16/393,852 filed on the same day as this application, a separate concept for modulating a static permanent magnet is introduced in which the permeability between adjacent serial permanent magnets was varied by mechanically actuating intermediate magnetostrictive elements thus changing the magnetic moment of the assembly. The technology described here is different than either of the aforementioned applications in that an oscillating magnetic field is created by varying the permeability between permanent magnets or electromagnets as well as the reluctance of a shunt magnetostrictive element ME2.

This document describes a low frequency oscillating magnetic field source based on a mechanically actuated and shunted magnetic dipole. It can be used in a transmitter configuration, whereby its frequency is modulated to encode information which is received by a remote AC magnetic field sensor. The disclosed technology has=a single or plurality of magnetic field sources (permanent or electromagnet) connected mechanically in series with a single or plurality of magnetoelastic components that modify their effective permeability in response to an applied tension or compression. Connected in shunt with this serial combination, is an additional magnetoelastic element which is actuated out of phase with the first serial combination such that when the permeability of the magnetoelastic elements in the series branch is maximized, the permeability of shunt magnetoelastic element is minimized and vice versa. By changing their permeability these elements effect the dipole moment of the system, causing the moment to oscillate between a small and large value. By operating the magnetoelastic component at mechanical resonance, power is minimized. To provide frequency control, we use an actuator to specify a time varying compressive load on the magnetoelastic component.

The presently disclosed technology may be used, for example, to communicate through solid or liquid barriers such as underground or underwater. Since low frequency magnetic fields can penetrate conductors this invention can potentially extend communication into these areas that are currently difficult to reach. Other potential uses include those in the oil and gas industry where communication with underground resources such as drilling equipment is currently limited to slow, high latency acoustic methods or custom expensive drill pipe with inductive coupling. Importantly, this communication can be initiated with a magnetic antenna whose size is many orders of magnitude smaller than a corresponding traditional wire antenna.

BRIEF DESCRIPTION OF THE INVENTION

This document describes a low frequency oscillating magnetic field source based on a mechanically actuated and shunted magnetic dipole. It can be used in a transmitter configuration, whereby its frequency is modulated to encode information which is received by a remote AC magnetic field sensor. The invention provides a single or plurality of magnetic field sources (permanent or electromagnet) connected mechanically in series with a single or plurality of magnetoelastic components that modify their effective permeability in response to an applied tension or compression. Connected in shunt with this serial combination, is an additional magnetoelastic element which is actuated out of phase with the first serial combination such that when the permeability of the magnetoelastic elements in the series branch is maximized, the permeability of shunt magnetoelastic element is minimized and vice versa. By changing their permeability these elements effect the dipole moment of the system, causing the moment to oscillate between a small and large value. By operating the magnetoelastic component at mechanical resonance, power is minimized. To provide frequency control, we use an actuator to specify a time varying compressive load on the magnetoelastic component.

DETAILED DESCRIPTION

Figures 1A, 1B:
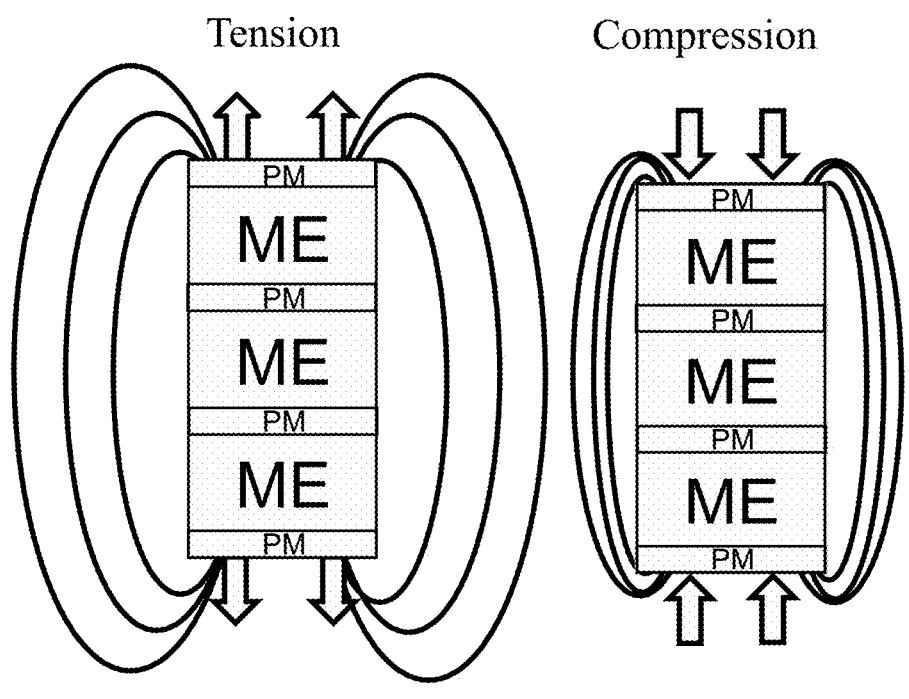
FIGS. 1A and 1B are an illustrations of magnetic fields of the magnetoelastic low frequency transmitter disclosed in U.S. patent application Ser. No. 16/393,852 filed on the same day as this application and which claims the benefit of US Provisional Patent Application Ser. No. 62/689,759 filed on 25 Jun. 2018 and entitled "A Mechanically Actuated Magnetostrictive Dipole Transmitter".

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features. In the following description we will first provide an overview of the principle components and function, then provide a technical rational for the operational principle, and finally provide design variations.

Magnetoelasticity (sometimes also called magnetostrictivity) is the coupling of an internal magnetic moment of a ferromagnetic material to its mechanical strain state. The orientation of the ferromagnetic moment is primarily determined by the interaction of the magnetization with applied field (Zeeman energy), the magnetocrystalline anisotropy (MCA), and the applied stress, or magnetoelastic coupling. The orientation of the moment within the material will be always found in a direction that minimizes the energies associated with these forces. In this invention we seek to first orient the magnetization along a preferred direction with a magnetic bias field. This bias field is preferably static and may be achieved through a solenoid, or preferably for power and space constrained applications, one or more permanent magnets (PMs) joined or placed in close proximity to a magnetoelastic material (labeled ME and ME2 in the accompanying figures). This provides an initial state with most ferromagnetic domains oriented such that the moment is oriented near to the field direction.

Stress is introduced into the magnetoelastic material (also called magnetostrictive material herein) such that the magnetization state of the material changes in response to the applied stress. Depending on the type of magnetoelastic material, different changes may occur upon the application of tensile or compressive stress. For some materials, like galfenol, tension tends to increase the relative permeability of the material (qualitatively making the material more steel like) while compression reduces the effective permeability of the material (qualitatively making the material more air like). So galfenol is one possible magnetoelastic material which may be utilized for the magnetoelastic elements labeled ME or ME2 in the accompanying figures.

There are other magnetoelastic (magnetostrictive) materials than galfenol which may be utilized or which may be developed in the future for magnetoelastic (magnetostrictive) material ME. It is to be understood that the discovery of new materials which are highly magnetostrictive (also called magnetoelastic in the art) is ongoing and moreover the discovery of new materials which exhibit very little magnetostrictiveness is also on going. So current magnetic materials can exhibit little or relatively large amounts of magnetostrictiveness. In this disclosure the term magnetostrictive (or magnetoelastic) material is intended to refer to magnetic materials whose magnetostrictiveness λ is at least 20 microstrains (50 microstrains is approximately the value of Ni). Generally speaking, the higher the number of microstrains the better for material ME, but there can be an engineering tradeoff since materials with greater magnetostrictiveness may be more expensive to utilize and may have greater temperature sensitivities (for some magnetostrictive alloys such as FeGaB, the Curie temperature can be as low as 350° C.). For the purposes of this disclosure, a non-magnetostrictive (or non-magnetoelastic) material has a λ that is less than 20 microstrains.

There are various ways in which this mechanically actuated transition from high permeability to low permeability can be utilized to build a variable magnetic transmitter. In a US Provisional Patent Application Ser. No. 62/522,519 filed Jun. 20, 2017 and entitled "Vibrational Magnetic Transmitter" it is proposed that one way in which this effect could be utilized, was to place a mass of magnetoelastic material (ME) next to a permanent magnet (PM) or a plurality of permanent magnets (see FIG. 1). When this system is placed in compression along the axis of magnetization, the permeability of the magnetoelastic element is reduced minimizing the effect of this shunt magnetoelastic element and thus increasing the magnetic field seen outside of the assembly. When the stress induced on the system is decreased the permeability of magnetoelastic element is increased rerouting the external flux lines into this element and thus reducing the magnetic field seen outside the assembly. In this way a variable magnetic field source is created such that increasing stress increases the magnetic field outside of the assembly and decreasing stress decreases the magnetic field outside of the assembly.

In U.S. Provisional Patent Application Ser. No. 62/689,759 filed on 25 Jun. 2018 and entitled "A Mechanically Actuated Magnetostrictive Dipole Transmitter" and its non-Provisional patent application Ser. No. 16/393,852 filed on the same date as this application it is proposed that an additional way in which this effect could be utilized, is to directly connect magnetoelastic or members (MEs) in series with permanent magnets (PMs) and then directly actuate this assembly along the axis of magnetization (see FIGS. 1A and 1B). When this system is placed in compression (see FIG. 1B), the permeability of the magnetoelastic elements or members ME are reduced, resulting in less induced magnetization along the field bias direction, and thus reducing the total magnetic moment of the assembly as well as the magnetic field seen outside of the assembly.

When the system is placed in tension (see FIG. 1A) the permeability of magnetoelastic element or member ME is increased, increasing the magnetic moment aligned in the direction of the bias magnetic field and thus increasing the total magnetic moment of the assembly as well as the magnetic field seen outside of the assembly. In this way a variable magnetic field source is created such that by changing the stress type (compression versus tension) and the magnitude of the stress, that action either reduces or increases the magnetic field outside of the assembly.

Figure 2:
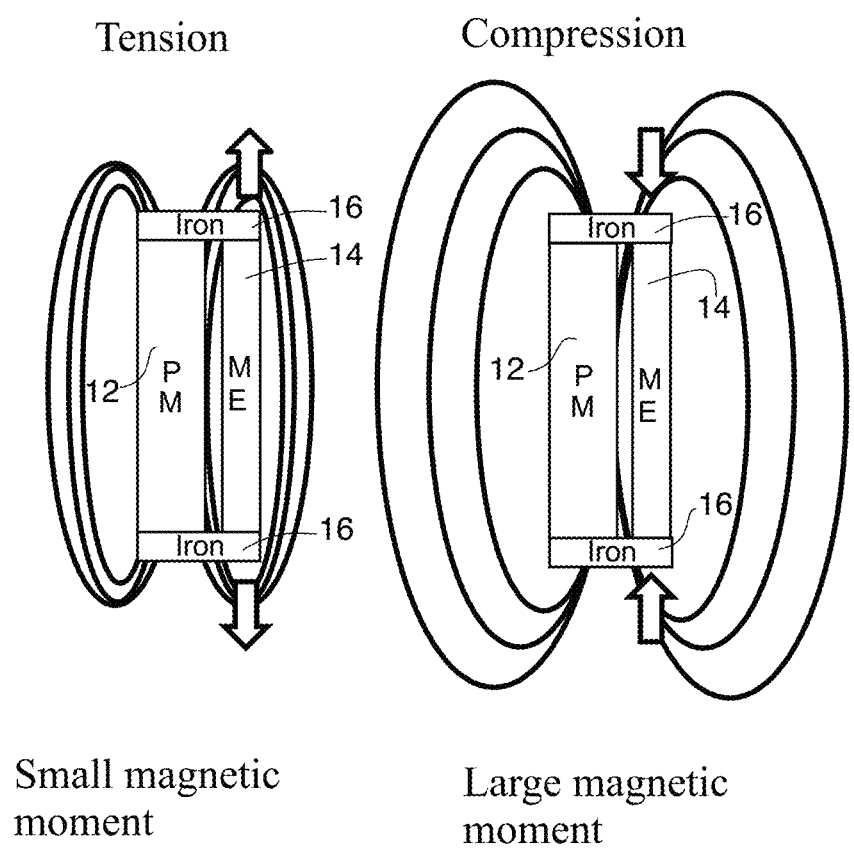
FIG. 2 is an illustration of the magnetic fields of a shunt version of the magnetoelastic (or magnetostrictive) low frequency transmitter disclosed herein and mechanical elements for inducing those magnetic fields.
Figure 2A:
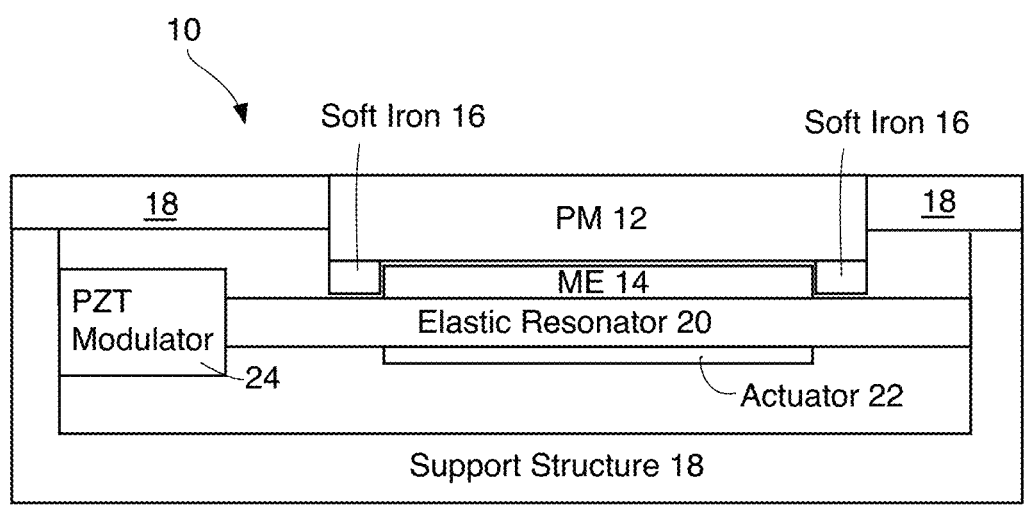
FIGS. 2A and 2B depict embodiments of a mechanically actuated and shunted magnetostrictive dipole transmitter that is consistent with the magnetic fields depicted in FIG. 2, with additional mechanical elements being also depicted. The embodiment of FIG. 2B has a simplified support structure compared to the embodiment of FIG. 2A.

In the present disclosure the two modes of operation of FIGS. 1A and 1B are utilized in an antenna 10, a first embodiment of which is depicted by FIGS. 2 and 2A. FIG. 2 shows the magnetic fields adjacent the antenna 10 while FIG. 2A depicts a possible corresponding mechanical embodiment. Note that the magnetoelastic element or member ME, by either being in compression or tension, will cause some bending to occur. In this embodiment of antenna 10 a first subassembly 12 comprises a permanent magnet (PM) element and a second subassembly 14 comprises a magnetoelastic element or member ME disposed between a permeable member or shunt 16 (such as, for example, iron (Fe), Metglas or other permeable, but non-magnetostrictive material).

FIG. 2A depicts a possible mechanical arrangement of elements 12, 14 and 16 previously discussed with reference to FIG. 2. Included in FIG. 2A is a support structure 18, an elastic resonator or beam member 20, an actuator (drive) 22, and an actuator (modulator) 24. The actuator (drive) 22 and the actuator (modulator) 24 of this and the other embodiments disclosed herein may be embodied by piezo-electric (PZT) devices. This arrangement is similar to that of FIG. 2 of U.S. patent application Ser. No. 16/393,852 filed on the same date as this application and entitled "A Mechanically Actuated Magnetostrictive Transmitter" except that the permanent magnet PM of the first assembly 12 is disposed alongside the magnetoelastic element or member ME of the second assembly 14 and is spaced further from a center line of elastic resonator or beam member 20 than is the magnetoelastic element or member ME of the second assembly 14, whereas in the other application the permanent magnet PM and the magnetoelastic element or member ME are arranged longitudinally of each other and on an opposing side of the elastic resonator member from the actuator (drive) member 22.

Figure 2B:
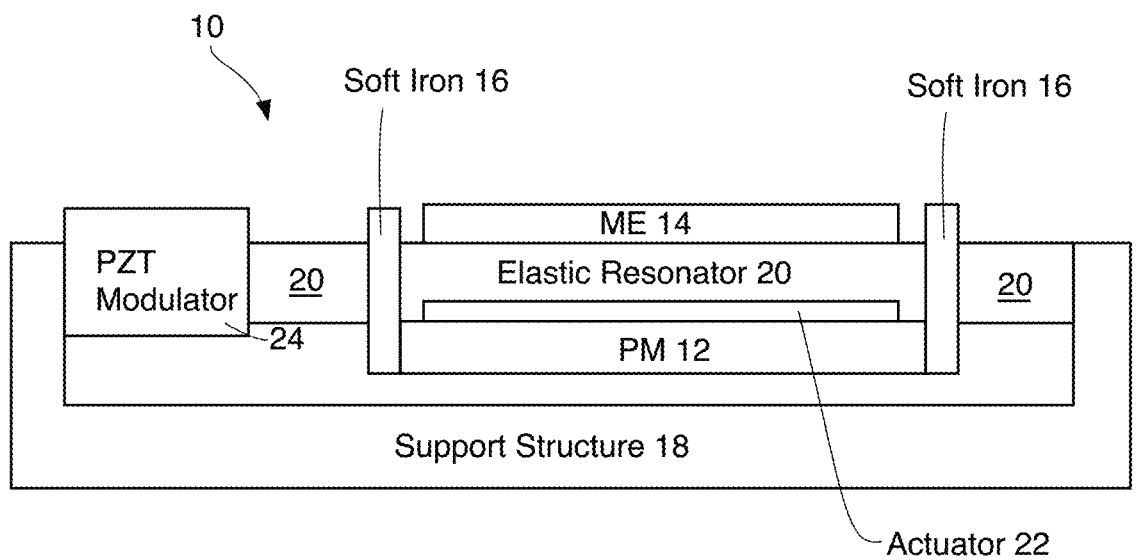

The embodiment of antenna 10 depicted by FIG. 2B has a simplified support structure 18 compared to the embodiment of antenna 10 depicted by FIG. 2A. In the embodiment of FIG. 2B the permanent magnet PM of the first assembly 12 is disposed next to the actuator (drive) 22, which is embedded in the elastic resonator or beam member 20, as opposed to being disposed next to the magnetoelastic element or member ME of the second assembly 14 as in the case of the embodiment of FIG. 2A.

Figure 3:
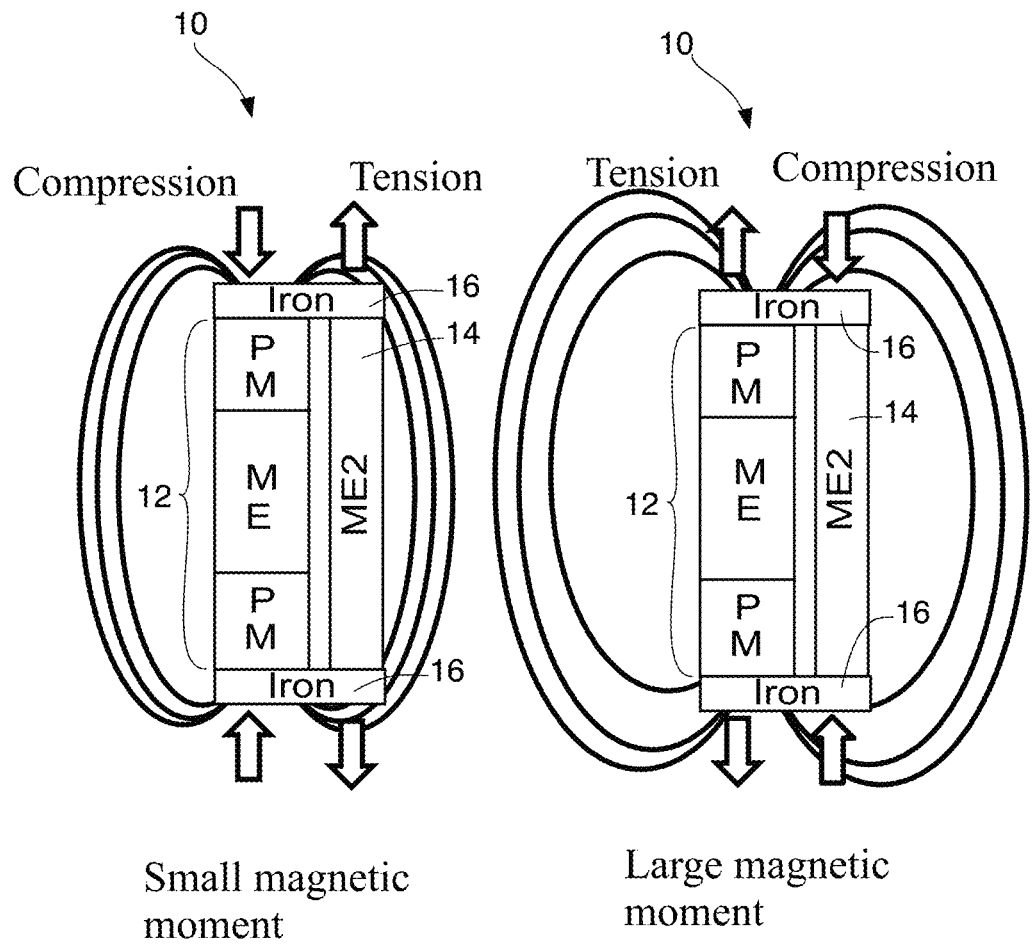
FIG. 3 is an illustration of hybrid version of the magnetoelastic low-frequency transmitter disclosed herein showing the magnetic fields that can be generated by the depicted mechanical elements.
Figure 3A:
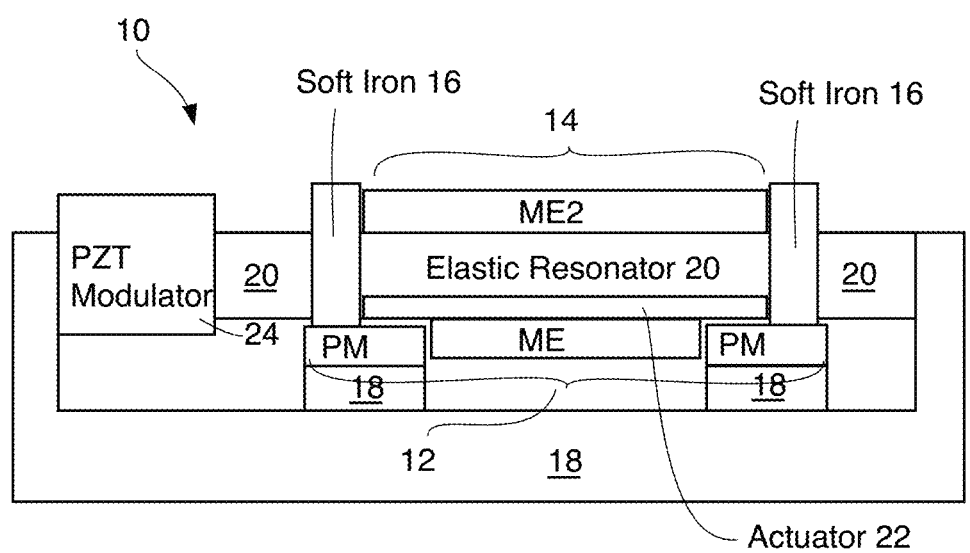
FIG. 3A depicts an embodiment of a mechanically actuated and shunted magnetostrictive dipole transmitter that is consistent with the magnetic fields depicted in FIG. 3 with additional mechanical elements being also depicted.

FIGS. 3 and 3A depict another embodiment of antenna 10 which has a first subassembly 12 of permanent magnets PM and magnetoelastic elements or members ME connected in series along a common axis of magnetization of those permanent magnets PMs and a second subassembly 14 connected in close proximity to the first subassembly 12 preferably via a permeable member 16 (such as, for example, soft iron, Fe or Metglas), the second subassembly 14 comprising a secondary magnetoelastic element or member ME2. The north and south ends of the two permanent magnets PM both point in the same direction.

Unlike the technology of FIGS. 1A and 1B described above, these two parts of this embodiment (for example, the series combination of permanent magnets PM and magnetoelastic elements or members ME of subassembly 12 and the shunt magnetoelastic element or member ME2 of subassembly 14) are actuated out of phase with one another such that when one component is in tension or low stress the other component is in compression and vice versa. Because the relationship between stress and external magnetic field is opposite in the previous disclosures shown in FIGS. 1A & 1B, the two components (subassemblies 12 and 14) of the presently disclosed technology depicted by FIGS. 3 and 3A are actuated out of phase in order to work in concert. In the embodiment of FIG. 3A, a single actuator 22 provides this out of phase actuation (relative compression of one subassembly along with relative tension of the other subassembly) due to the positioning of the single actuator along one side of the elastic resonator or beam member 20.

The arrows of FIG. 3, which figure depict the primary magnetic field inducing elements and the generated magnetic fields, show the directions of forces which are applied to create either the compression and/or tension of the subassemblies 12 and 14. These forces may be applied using piezoelectric materials for actuator 22 as taught, for example, in U.S. Provisional Patent Application Ser. No. 62/689,759 filed on 25 Jun. 2018 and entitled "A Mechanically Actuated Magnetostrictive Dipole Transmitter" and its non-Provisional patent application Ser. No. 16/393,852 filed on the same date as this application and as is provided by the drive actuator 22 of FIG. 3A herein. The permeable members or shunts 16 apply magnetization from the two permanent magnets PM to the magnetoelastic element or member ME of subassembly 12 and the shunt magnetoelastic element or member ME2 of subassembly 14. The permeable members or shunts 16 can penetrate the elastic resonator or beam member 20 or encompass it (as suggested or taught by FIGS. 3A and 4E).

This combined or hybrid actuation system has a number of unique design parameters and constraints that allow increased field generation efficiency compared to the technology of U.S. patent application Ser. No. 16/393,852 filed on the same day as this application and which claims the benefit of U.S. Provisional Patent Application Ser. No. 62/689,759 filed on 25 Jun. 2018 and entitled "A Mechanically Actuated Magnetostrictive Dipole Transmitter". First, the distance between the series combination of permanent magnets/magnetoelastic blocks PM/ME (of subassembly 12) and the shunt magnetoelastic member ME2 (of subassembly 14) can be configured such that the total magnetic field passing through the permeable members or shunts 16 does exceed the saturation field of the material used therefor. In addition, as the aspect ratio of the permanent magnets PM is increased the magnetic flux seen by the magnetoelastic elements or members ME and ME2 is also increased, this in turn suggests that (1) the magnetoelastic elements or members ME in series with the permanent magnets PM be made thicker and (2) the shunt magnetoelastic element or member ME2 should be placed farther away from the serial combination of permanent magnets and magnetoelastic elements ME (of subassembly 12) and/or made thicker to allow for larger magnetic flux without saturating the magnetic flux.

FIGS. 3 and 3A depict an embodiment where the shunt magnetoelastic element or member ME2 is connected across the entire subassembly 12 of permanent magnets and magnetoelastic elements or members ME while FIGS. 4A-4D depict embodiments with multiple shunt magnetoelastic elements or members ME2 connected across each permanent magnet PM. Furthermore the shunt magnetoelastic element/elements or members ME2 can be connected to the assembly 12 of permanent magnets PM and magnetoelastic elements or members ME either by permeable members or shunts 16 or alternately by non-permeable members (wherein the depicted members 16 may be embodied by air gaps or some other non-permeable material), but it should be realized that utilizing non-permeable members (such as air gaps) would reduce the effectives of the shunting elements or members ME2.

Additionally, the open region between the two shunt magnetoelastic elements or members ME2 may be filled with a non-ferromagnetic material such as a metal (e.g., titanium, aluminum) or a polymer (epoxy, polyurethane, PEEK) material in order to transmit compression and tension forces to the magnetoelastic elements or members ME2.

Figures 4A, 4B:
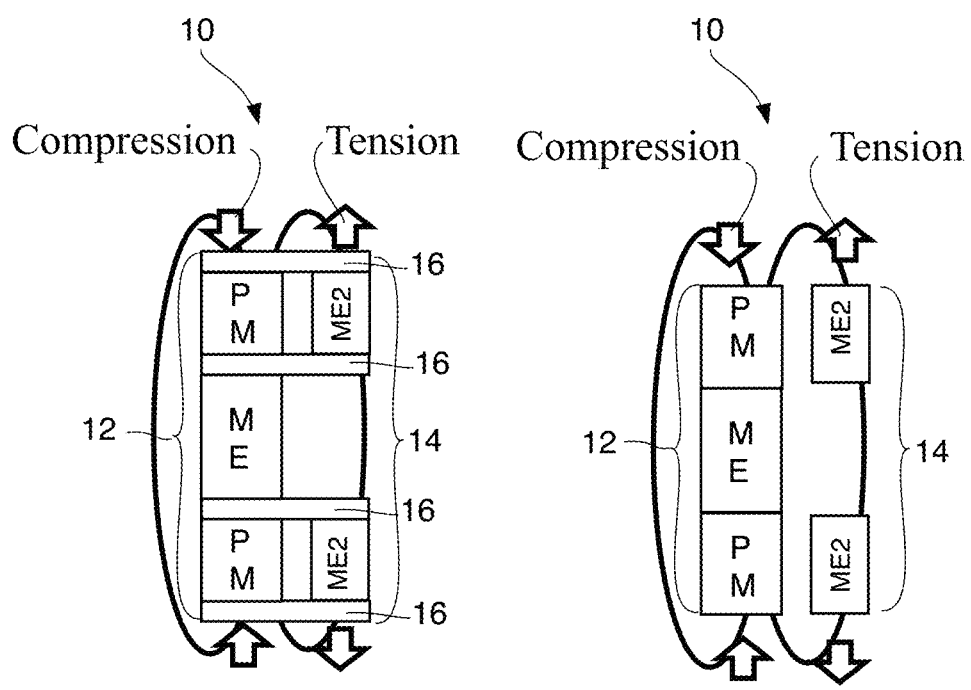
FIGS. 4A and 4B are illustrations of alternative shunting configurations for a hybrid magnetoelastic low frequency transmitter which depict the magnetic fields that can be generated by those alternative shunting configurations.
Figure 4C:
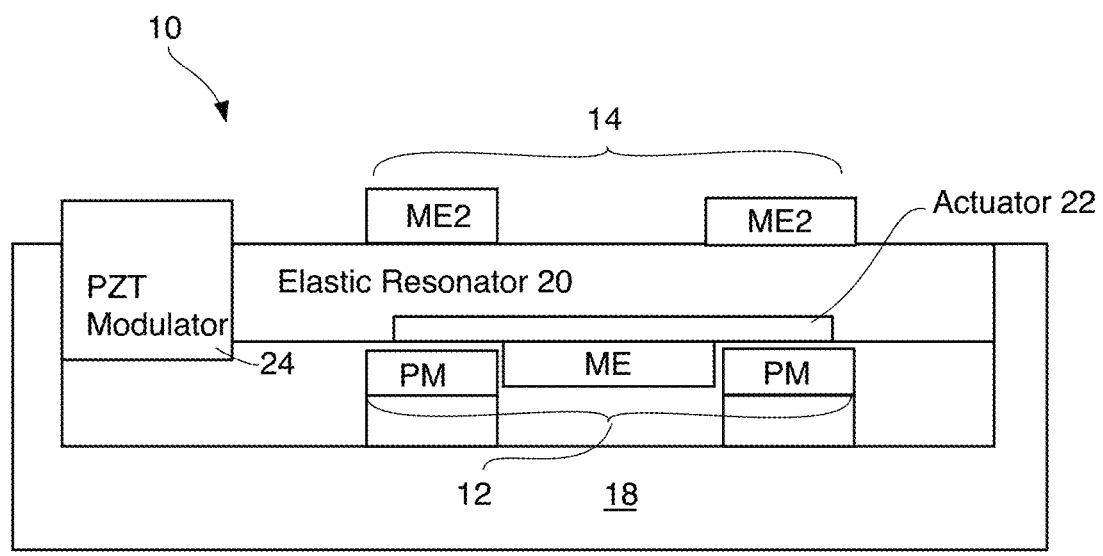
FIGS. 4C and 4D depict embodiments of a mechanically actuated and shunted magnetostrictive dipole transmitter that are consistent with the magnetic fields shown in FIGS. 4A and 4B with additional mechanical elements being also depicted.
Figure 4D:
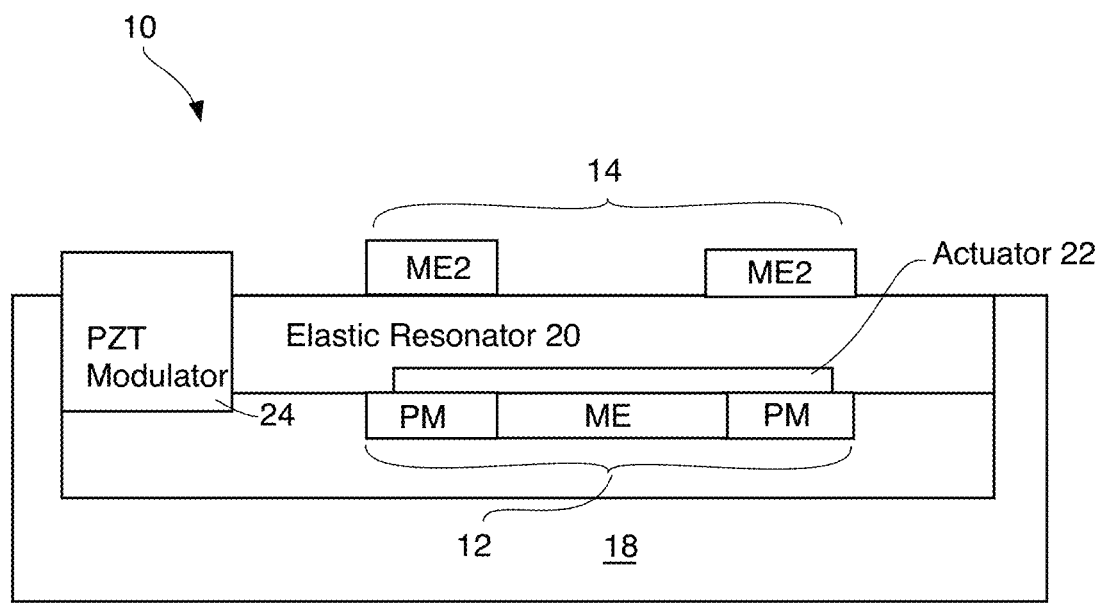

The high permeability members or shunts 16 may be omitted as is demonstrated by the embodiments of FIGS. 4B, 4C and 4D. It is should be noted that even when the high permeability members or shunts 16 are omitted, the shunt magnetoelastic element/elements or members ME2 of assembly 14 continue to be disposed in a shunting relationship relative to the permanent magnets PM and magnetoelastic elements or members ME of assembly 12.

FIGS. 4C and 4D depict embodiments of antenna 10 consistent with the magnetic fields shown in FIGS. 4A and 4B. In FIG. 4C subassembly 14 comprises two magnetoelastic elements or members ME2 (which are affixed to a first side of the elastic resonator or beam member 20) and another magnetoelastic element or member ME affixed to a second side of the elastic resonator or beam member 20 (as a part of subassembly 12). The two magnets PM are supported by or from the support structure 18 (and thus are spaced a small distance from the magnetoelastic member ME on the second side of elastic resonator or beam member 20) in the embodiment of FIG. 4C. In FIG. 4C, the two magnets PM supported by or from the support structure 18 and the another magnetoelastic member ME affixed to the second side of the elastic resonator or beam member 20 form subassembly 12. The use of permeability members or shunts 16 has been omitted from these embodiments, but they may be added thereto similar to the embodiments of FIGS. 2A, 2B, 3A and 4E.

In FIG. 4D subassembly 14 again comprises two magnetoelastic members ME2 (which are affixed to a first side of the elastic resonator or beam member 20) and another magnetoelastic member ME affixed to a second side of the elastic resonator or beam member 20 along with two magnets PM. The two magnets PM and the another magnetoelastic member ME are affixed to the second side of the elastic resonator or beam member 20 and form subassembly 12. The use of high permeability members or shunts 16 has also been omitted from the embodiments of FIG. 4D, but they may be added thereto similar to the embodiments of FIGS. 2A, 2B, 3A and 4E.

Figure 4E:
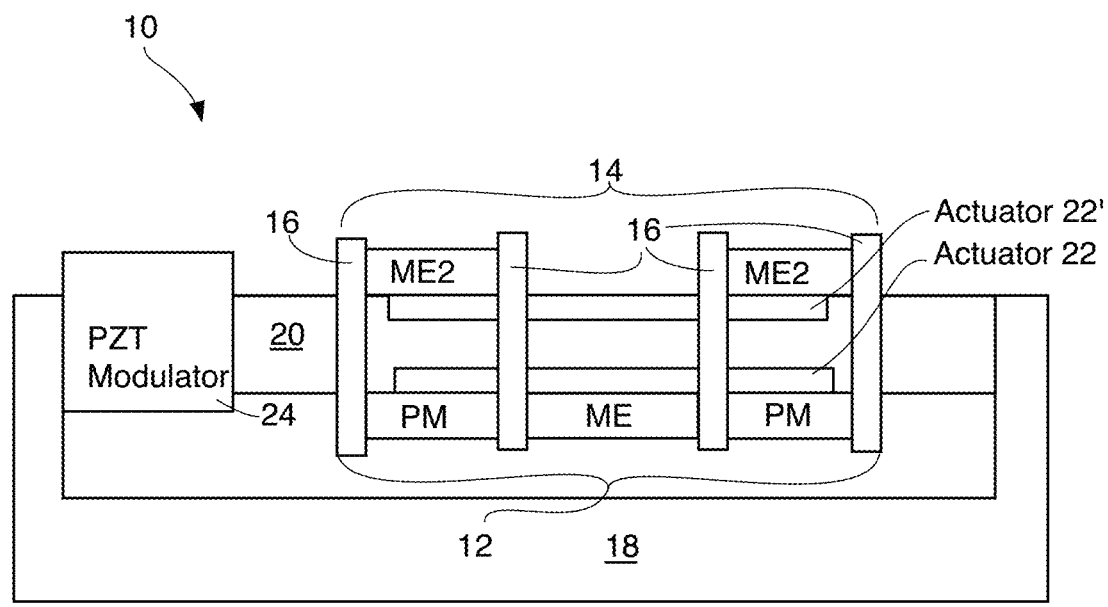
FIG. 4E depicts an embodiment of a mechanically actuated and shunted magnetostrictive dipole transmitter that is consistent with FIG. 4A in that it includes multiple permeable members (as does FIG. 4A) and also demonstrates the possibility of utilizing multiple actuators adjacent or in the elastic resonator body.

FIG. 4E depicts an embodiment of a mechanically actuated and shunted magnetostrictive dipole transmitter that is consistent with FIG. 4A in that it includes multiple permeable members or shunts 16 (as does FIG. 4A) and also demonstrates the possibility of utilizing multiple actuators 22 and 22' adjacent or embedded in the elastic resonator or beam member 20.

The disclosed antenna can operate in the VLF and ULF bands having a physical size (the overall length of the antenna 10 shown in the figures) in a range of, for example, 1 cm to 1 m and preferably 1 to 10 cm. Those skilled in the art will recognize that these lengths are at least 2 to 3 orders of magnitude smaller than a conventional wire antenna.

Further, while not shown in detail herein, the magnetoelastic members ME may be fabricated as part of a composite beam structure 20 where the magnetoelastic members ME and/or the magnets (PM) are embedded in an elastic core of the resonator beam member 20 along with also actuator 22. See, for example, U.S. Provisional Patent Application Ser. No. 62/689,759 filed on 25 Jun. 2018 and entitled "A Mechanically Actuated Magnetostrictive Dipole Transmitter" and its non-Provisional patent application Ser. No. 16/393,852 filed on the same date as this application and incorporated herein by reference. With a composite beam structure 20, the magnetoelastic members ME will resonate in a bending mode when suitable compression and/or tension forces are applied. If the magnetoelastic component ME is mated to an elastic, non-ferromagnetic material such as titanium, aluminum, or carbon fiber composite, the composite beam structure 20 may be designed so that at its natural bending mode, the magnetoelastic material ME undergoes uniform compression or tension. The advantage of this embodiment of the disclosed elastic resonator or beam member 20 is that the resonant frequency may be highly controlled by selecting the aspect ratio (beam length versus thickness) as well as the elastic properties of the constituents (elastic modulus and density). The bending member can be mechanically excited by incorporating a piezoelectric actuator on the opposite side to the magnetoelastic member ME such that by exciting the actuator, the resonator is excited harmonically, and preferably at the mechanical resonance frequency of the beam. The magnetic principal is exactly the same regardless of how the stress is created in the magnetoelastic member(s).

The elastic resonator or beam member 20 may have any convenient shape in cross section, with a square, rectangular or round cross section being the most convenient. A tubular section may also be used to alter the weight or resonant frequency characteristics. The high permeability members or shunts 16 may completely or partially penetrate that cross section or merely surround or encompass it. The magnets PM, magnetoelastic members ME and ME2, and the actuator 22 may be disposed within a cross section of the elastic resonator or beam member 20 or merely be disposed adjacent it (in some embodiments, immediately adjacent or contacting the elastic resonator or beam member 20 and in other embodiments spaced a short distance away from the elastic resonator or beam member 20).

The magnets PM may comprise electromagnets, if desired, but that may complicate the design in that wires (or other electrical conductors) will need to be provided to provide the electromagnets with a DC current to induce electromagnetism in them. Such wires or other electrical conductors are not shown in the present embodiments.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A magnetic transmitting antenna comprising:
   i. an elastic member;
   ii. at least one magnetoelastic member disposed on or adjacent at least a first surface of the elastic member; and
   iii. an actuator disposed on the first surface or on an another surface of the elastic member, wherein the actuator is configured to apply stress to the elastic member thereby applying mechanical stress thereto for changing the magnetic permeability of the at least one magnetoelastic member, which in turn, changes an external magnetic field; and
   iv. at least one magnet disposed adjacent or in contact with the at least one magnetoelastic member such that at least a portion of its magnetic flux is induced in the at least one magnetoelastic member; and
   wherein the at least one magnetoelastic member and the at least one magnet is or are coupled in a configuration such that magnetic flux from the at least one magnet passes through the at least one magnetoelastic member in a varying amount as a function of an amount of mechanical stress induced in the elastic member thereby changing the magnetic permeability of the at least one magnetoelastic member by said actuator.

2. The magnetic transmitting antenna of claim 1 wherein the mechanical stress applied by the actuator to the elastic member induces either (i) tension in the at least one magnetoelastic member thereby producing a relatively smaller magnetic moment to the external magnetic field or (ii) compression in the at least one magnetoelastic member thereby producing a relatively larger magnetic moment to the external magnetic field.

3. The magnetic transmitting antenna of claim 2 wherein the at least one magnet is disposed on a second surface of the elastic member.

4. The magnetic transmitting antenna of claim 2 wherein the magnet is disposed adjacent to the magnetoelastic member but spaced from said magnetoelastic member and spaced from said elastic member.

5. The magnetic transmitting antenna of claim 1 further including a second actuator for applying a varying axial stress to the elastic member, thereby modulating the external magnetic field according to how the axial stress applied to the elastic member is varied.

6. The magnetic transmitting antenna of claim 5 further including a support structure, one surface of the second actuator and another surface of the elastic member being held in place by said support structure.

7. The magnetic transmitting antenna of claim 6 wherein the magnet is disposed adjacent to the magnetoelastic member but spaced from said magnetoelastic member and spaced from said elastic member.

8. The magnetic transmitting antenna of claim 7 wherein the magnet forms a portion of said support structure.

9. The magnetic transmitting antenna of claim 1 wherein the at least one magnet comprises at least two magnets disposed in a subassembly with said magnetoelastic member disposed between the at least two magnets in a linear configuration of the at least two magnets and said magnetoelastic member.

10. The magnetic transmitting antenna of claim 9 wherein the mechanical stress applied by the actuator to the elastic member induces, in a first vibratory state, (i) compression in the subassembly of the at least two magnets and said magnetoelastic member and (ii) simultaneous tension in at least one shunt magnetoelastic member thereby producing a relatively smaller magnetic moment to the external magnetic field or induces, in a second vibratory state, (i) tension in the assembly of the at least two magnets and said magnetoelastic member and (ii) simultaneous compression in the at least one shunt magnetoelastic member thereby producing a relatively larger magnetic moment to the external magnetic field.

11. The magnetic transmitting antenna of claim 9 wherein the at least one magnetoelastic member comprises at least two magnetoelastic members spaced from each other disposed on the first surface of the elastic member.

12. The magnetic transmitting antenna of claim 11 wherein the at least two magnetoelastic members are disposed in an opposing configuration to the at least two magnets on or adjacent first and second surfaces of the elastic member.

13. The magnetic transmitting antenna of claim 1 wherein the actuator is a PZT device.

14. The magnetic transmitting antenna of claim 1 wherein the magnetoelastic member is disposed in a first subassembly and at least another magnetoelastic member is disposed in a second subassembly, the first and second subassemblies being actuated out of phase with respect to each other by the actuator.

15. The magnetic transmitting antenna of claim 14 wherein the at least one magnet comprises at least two magnets which are also disposed in said first subassembly.

16. The magnetic transmitting antenna of claim 14 wherein said first subassembly comprises at least two magnetoelastic members.

17. The magnetic transmitting antenna of claim 1 further including a plurality of high permeability members or shunts associated with the elastic member which concentrate magnetic flux of the at least one magnet into the at least one magnetoelastic member.

18. The magnetic transmitting antenna of claim 1 wherein the amount of mechanical stress applied by the actuator to the elastic member induces, in a first vibratory state, (i) compression in an subassembly of the at least one magnet and said at least one magnetoelastic member and (ii) simultaneous tension in at least one shunt magnetoelastic member thereby producing a relatively smaller magnetic moment to the external magnetic field or induces, in a second vibratory state, (i) tension in the subassembly of the at least one magnet and said at least one magnetoelastic member and (ii) simultaneous compression in the at least one shunt magnetoelastic member thereby producing a relatively larger magnetic moment to the external magnetic field.

19. The magnetic transmitting antenna of claim 18 further including at least one permeable member or shunt magnetically coupling the at least one magnetoelastic member with the at least one magnet and also with the at least one shunt magnetoelastic member.

20. The magnetic transmitting antenna of claim 1 wherein the at least one magnetoelastic member is disposed on or adjacent the actuator.

21. The magnetic transmitting antenna of claim 20 further including another actuator disposed on different surface of said elastic member than the first mentioned actuator.

22. The magnetic transmitting antenna of claim 1 wherein the at least one magnetoelastic member is disposed on the elastic member.

23. The magnetic transmitting antenna of claim 1 wherein the elastic member is configured as a beam with the at least one magnetoelastic member being attached thereto.

24. The magnetic transmitting antenna of claim 23 wherein the actuator is embedded in the elastic member.

25. The magnetic transmitting antenna of claim 1 wherein the elastic member is configured as a beam with the actuator being embedded.

26. The magnetic transmitting antenna of claim 1 further including at least one permeable member or shunt magnetically coupling the at least one magnetoelastic member with the at least one magnet.

27. An antenna device comprising:
  i. an assembly comprising one or more permanent magnets and/or electromagnets and one or more magnetoelastic elements magnetically coupling said permanent magnets and/or electromagnets along an axis of magnetization of said one or more permanent magnets and/or electromagnets;
  ii. one or more shunt magnetoelastic elements connected in a shunt configuration across said assembly; and
  iii. a piezoelectric actuator operatively coupled to the assembly for mechanically loading the assembly including its one or more magnetoelastic elements in a bending vibratory mode.

28. The antenna device of claim 27 wherein magnetic flux from the one or more permanent magnets and/or electromagnets passes through the one or more magnetoelastic elements in a varying amount as a function of an amount of mechanical stress induced in the assembly by said piezoelectric actuator.

29. The antenna device of claim 28 wherein said piezoelectric actuator, in use, operates at a frequency at or very close to a mechanical resonant frequency of the antenna device.

30. The antenna device of claim 28 wherein said piezoelectric actuator, in use, operates at a plurality of frequencies simultaneously.

31. In combination,
  one or more magnetic field sources (permanent or electromagnetic),
  one or more magnetoelastic components arranged in a serial arrangement of said one or more magnetoelastic components and said one or more magnetic field sources,
  at least one actuator operatively coupled with said serial arrangement for modifying an effective permeability of said one or more magnetoelastic components in response to tension or compression applied by said actuator, wherein tension in said one or more magnetoelastic components produces a relatively smaller magnetic moment to an external magnetic field compared with compression in said one or more magnetoelastic components which produces a relatively larger magnetic moment to the external magnetic field.

32. The combination of claim 31, further including at least an additional shunt magnetoelastic element which is actuated out of phase with the serial arrangement such that when the permeability of the at least an additional shunt magnetoelastic element is maximized, the permeability of the one or more magnetoelastic components arranged in the serial arrangement is minimized and vice versa.

33. The combination of claim 32 wherein the at least an additional shunt magnetoelastic element is arranged in a second serial arrangement of said at least an additional shunt magnetoelastic component.

34. The combination of claim 31 wherein the actuator, in use, applies a time varying compressive and/or tensile load to the one or more magnetoelastic components.

\* \* \* \* \*